United States Patent
Reiss et al.

(10) Patent No.: US 11,165,553 B1
(45) Date of Patent: Nov. 2, 2021

(54) STATIC CLOCK CALIBRATION IN PHYSICAL LAYER DEVICE

(71) Applicant: Cadence Design Systems, Inc., San Jose, CA (US)

(72) Inventors: Loren B. Reiss, Raleigh, NC (US); Scott David Huss, Cary, NC (US); Christopher George Moscone, Cary, NC (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 17/018,529

(22) Filed: Sep. 11, 2020

(51) Int. Cl.
*H04L 7/033* (2006.01)
*H04L 7/00* (2006.01)
*H04L 1/24* (2006.01)
*H03L 7/081* (2006.01)

(52) U.S. Cl.
CPC .......... *H04L 7/0025* (2013.01); *H03L 7/0812* (2013.01); *H04L 1/243* (2013.01); *H04L 7/0337* (2013.01)

(58) Field of Classification Search
CPC ..... H04L 7/0025; H04L 7/0337; H04L 1/243; H03L 7/0812
See application file for complete search history.

(56) References Cited

U.S. PATENT DOCUMENTS

| | | | |
|---|---|---|---|
| 2017/0346617 A1* | 11/2017 | Bandi | H04L 7/0008 |
| 2019/0173661 A1* | 6/2019 | Aleksic | H03L 7/081 |
| 2020/0036464 A1* | 1/2020 | Bassett | H04L 7/033 |
| 2020/0287702 A1* | 9/2020 | Toi | H04L 7/0037 |

* cited by examiner

*Primary Examiner* — Dac V Ha
(74) *Attorney, Agent, or Firm* — Schwegman Lundberg & Woessner, P.A.

(57) ABSTRACT

A phase interpolator of a physical layer (PHY) device comprise a phase interpolator to generate a set of asynchronous sampler clocks. A sampler of the PHY device samples a calibration data pattern using a first sampler clock from the set of asynchronous sampler clocks. A calibration control component of the PHY device detects a misalignment of a phase relationship among the set of asynchronous sampler clocks based on the sampled data. In response to detecting the misalignment, the calibration control component calibrates the first sampler clock using a second sampler clock and a third sampler clock.

20 Claims, 9 Drawing Sheets

STATIC CLOCK CALIBRATION IN PHYSICAL LAYER DEVICE

TECHNICAL FIELD

The present disclosure generally relates to integrated circuits (ICs). In particular, the present disclosure addresses clock calibration in a physical layer (PHY) device.

BACKGROUND

A PHY is an electronic circuit that connects a link layer device to a physical medium such as an optical fiber or copper cable. A transmitter (TX) PHY transmits data to a receiver (RX) PHY to facilitate data transfer. A RX PHY can include multiple samplers to sample incoming data received from a TX PHY. Each sampler samples data based on a rising edge of one of multiple sampler clock signals.

The alignment of the phases of the sampler clock signals is critical to reliable data transfer. For example, misalignment of phase relationships in the sampler clock signals can result in distortions in the sampled data, thereby reducing data transmission reliability. Phase relationships among the sampler clock signals can become misaligned during data transfer, for example, because of offsets in threshold voltages of samplers. Conventional techniques for calibrating sampler clocks do not correct skews in the routing to the sampler or skews within the sampler. Such techniques rely predominately on analog components that increase noise and error in data.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

As noted above, alignment of phases of sampler clock signals in PHY devices is critical to reliable data transmission. Aspects of the present disclosure address misalignment of phase relationships among sampler clocks with calibration methods, systems, and devices. An example RX PHY includes N+1 high speed analog RX sampler clocks that are driven by a phase interpolator (PI) in an analog lane and distributed to a high speed RX sampler latch and deserializer functions. The rising or falling edges of N of the sampler clocks can be used to sample N consecutive unit intervals (UI) of the received high speed data at the center of each respective UI. The rising or falling edge of the N+1 sampler clock is used to sample the data crossing point between UI 0 and UI 1 of the N consecutive UIs of received high speed data.

Due to imperfections that can exist in the generation and distribution of these sampler clocks, the phase relationship of these clocks relative to each other can become distorted. An RX PI static clock calibration process in each lane detects such phase imperfections and corrects them. For this calibration process, a unique data pattern is selected to be transmitted by a far end transmitter. When this data pattern is sampled by the RX sampler latches, using a clock that is asynchronous in frequency to the received high speed data, distortions in the phase delay can be observed by the digital PI static clock calibration function. This calibration function drives calibration codes to the analog elements connected to the PI that enable the phase delay of each sampler clock to be adjusted based on the sampled data.

Figure 1:
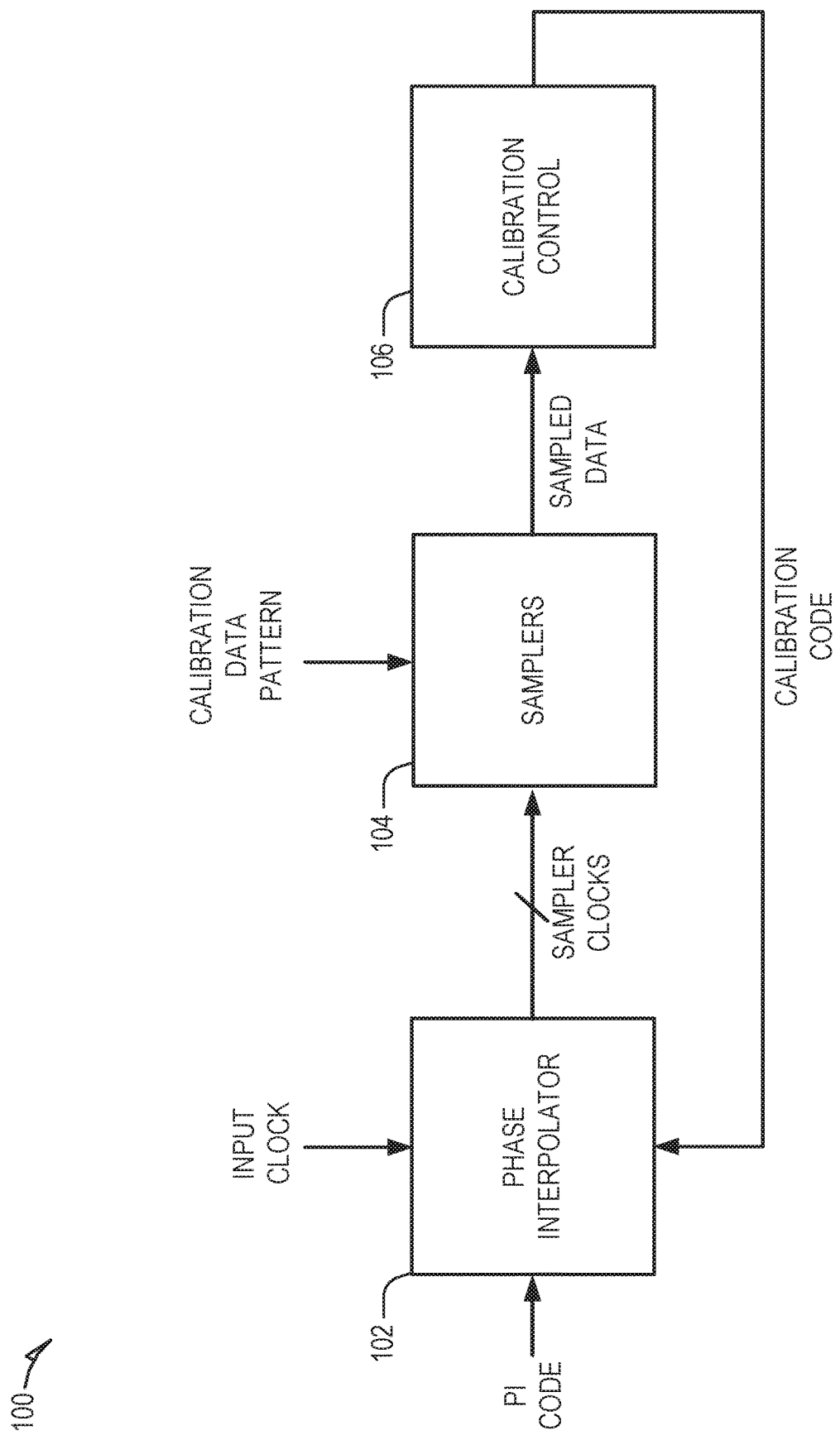
FIG. 1 is a block diagram illustrating a PHY device configured for static clock calibration, according to some example embodiments.

With reference to FIG. 1, a PHY device 100 is illustrated, according to some example embodiments. The device 100 comprises a PI 102, samplers 104, and a calibration control component 106. The PI 102 provides a set of asynchronous clock signals at its output based on an input clock signal received at its input. The set of synchronous clock signals are used during normal modes of operation to sample incoming data and are thusly referred to as "sampler clocks." The input clock signal is provided by an on-chip clock source. The PI 102 generates the set of asynchronous clock signals by constantly rotating at a rate defined by phase interpolator code that is initially provided as input to the PI 102. That is, phase interpolator code causes the PI 102 to constantly rotate at a particular rate to generate the sampler clocks.

Figure 2A:
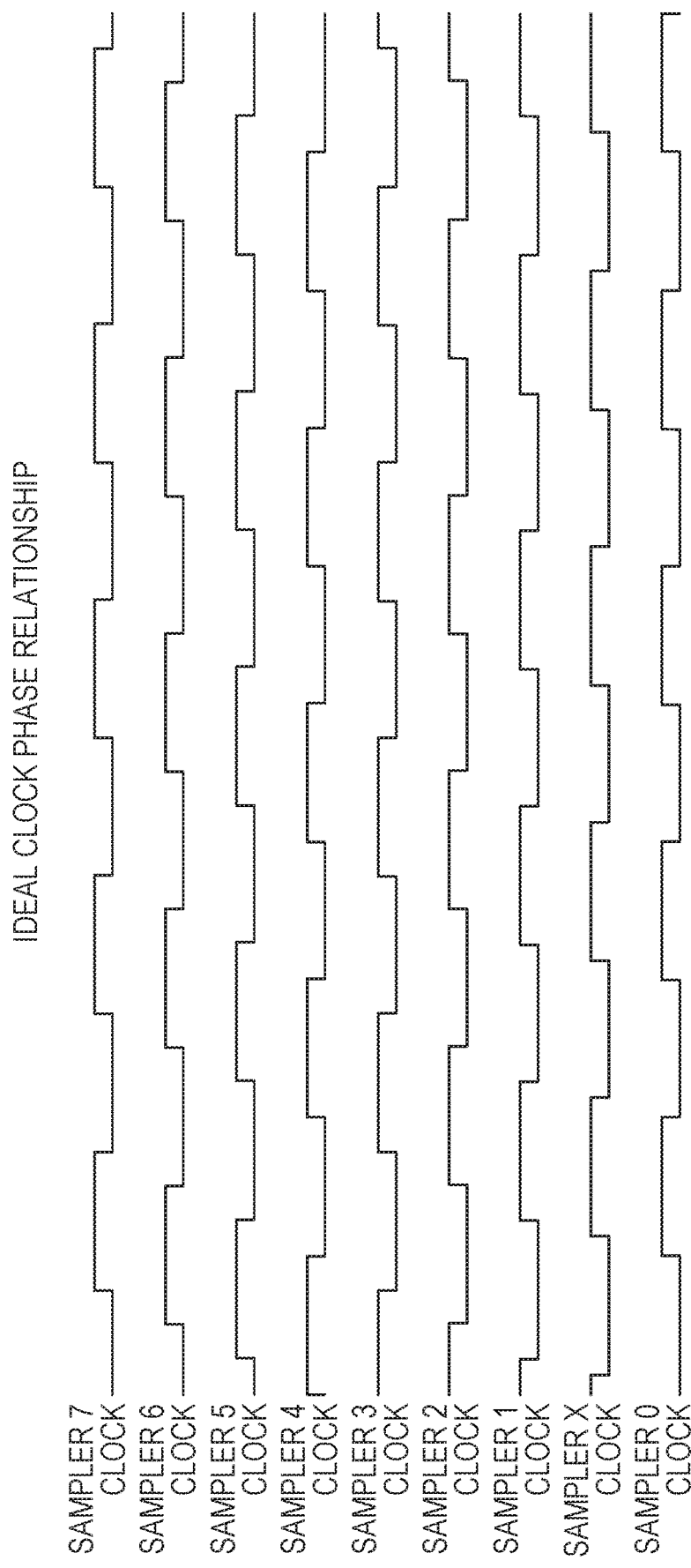
FIGS. 2A and 2B are timing diagrams that illustrate aligned and misaligned phase relationships among a set of sampler clocks, according to some example embodiments.
Figure 2B:
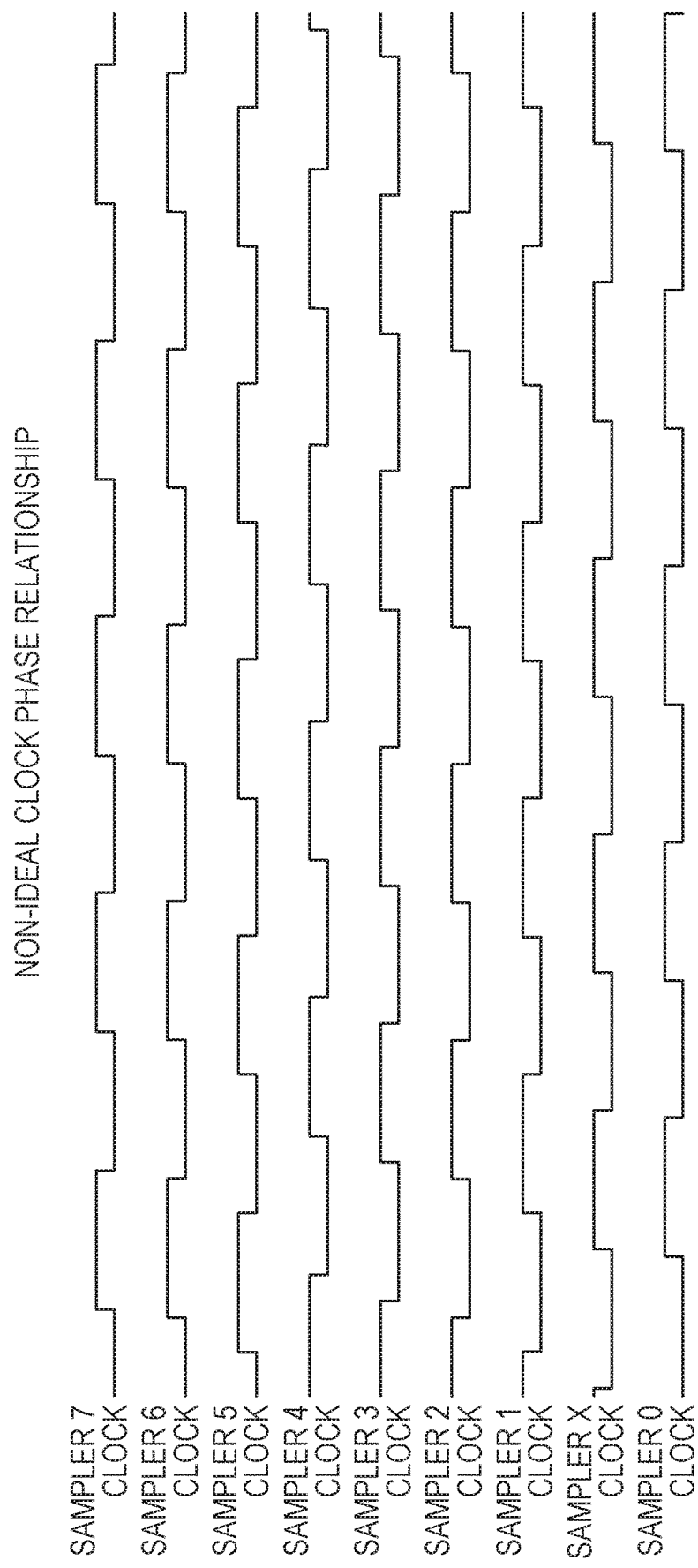

N data sampler clocks are generated by the phase interpolator 120 along with one or more edge sampler clocks (e.g., a zero-crossing sampler clock). Ideally, the sampler clocks have the following phase relationships: 1) the rising edges of data sampler clock signals are equal in time between their respective rising edges; and 2) the edge sampler clock's rising edge is equal in time between a first data sampler clock signal and a second data sampler clock signal. FIG. 2A illustrates example target (ideal) phase relationships among the sampler clocks. As illustrated in FIG. 2B, imperfections can exist that can result in these clocks signals having misaligned phase relationships relative to each other.

Retuning to FIG. 1, to address the misalignment of phase relationships among the sampler clocks, analog delay elements are included at the output of the phase interpolator to introduce delays into the sampler clocks to compensate for misaligned phase relationships. The calibration control component 106 detects differences in the phase relationships of sampler clocks and adjusts them to meet the ideal phase relationships using calibration codes that control the analog delay elements for each clock.

As shown, the sampler clocks are provided to the samplers 104. As noted above, in normal operation modes, the samplers 104 use the rising or falling edge of sampler clocks to sample incoming data received from a transmitter. As an example, the components of the device 100 can form part of a receiving PHY that is in communication with a transmitting PHY to enable high-speed communication. In this example, the samplers 104 use the sampler clocks to sample incoming data received from the transmitting PHY.

While in calibration mode, the sampler uses the sampler clocks to sample a calibration data pattern (e.g., 0xFF00FF00) received from a far end transmitter in communication with the device 100. The device 100 can be placed into calibration mode at start-up or during any period in which incoming data is not being received. During calibration, the clock frequency of the sampler clocks driven by the PI 102 are the same phase relative to each other but are not the correct frequency to sample the incoming calibration data pattern. That is, the frequency may be either faster or slower than the frequency needed to accurately sample the incoming calibration data pattern. Therefore, over time, the sampler clocks will effectively sweep across the incoming calibration data pattern. The incoming calibration data pattern is configured such that the received data pattern spends an equal number of UIs in the low state and in the high state.

Depending on the embodiment, the frequency of the sampler clocks can be established in multiple ways, which can be selected using register programming. In a first example, a phase interpolates up condition is forced every other clock cycle. In a second example, a continuous repeating pattern of 0, −1, −2, −3, −2, −1 can be provided as the phase interpolator code to the phase interpolator. The duration of time between each change is programmable. As a third example, the phase interpolator code can be adjusted by a constant value of −1, −2, or −3.

Sampled data from the incoming calibration data pattern output by the samplers 104 is provided to the calibration control component 106. As referenced above, the calibration control component 106 can detect a misalignment in phase relationships among the sampler clocks based on the sampled data. For example, the calibration control component 106 can count the number of 1s and 0s and detect a misalignment if the two counts are not equal. As another example, the calibration control component 106 can count occurrences of two predefined patterns in the sampled data and detects a misalignment if the two counts are not equal. In some other embodiments, the calibration control component 106 counts the number of logical 1s and 0s and detects a misalignment if the two counts are not equal. To this end, the calibration control component 106 can include one or more accumulators to count occurrences of 1s and 0s or other patterns in the data.

Upon detecting a misalignment in the phase relationships, the calibration control component 106 adjusts the phase of one or more sampler clocks by providing an appropriate calibration code to the PI 102. For each sampler clock, the calibration control component 106 uses two sampler clocks for calibration. For example, the calibration control component 106 can phase shift a first sampler clock such that the first sampler clock is in quadrature with a second sampler clock and a third sampler clock.

To avoid obscuring the inventive subject matter with unnecessary detail, various functional components that are not germane to conveying an understanding of the inventive subject matter have been omitted from FIG. 1. However, a skilled artisan will readily recognize that various additional functional components may be included as part of the device 100 to facilitate additional data transfer functionality that is not specifically described herein. For example, the PHY device 100 may be a PHY RX and can further include one or more deserializers to deserialize the sampled data prior to evaluation by the calibration control component 106.

FIGS. 3A-3D are timing diagrams illustrating an operation of detecting phase relationships between sampler clocks during calibration, according to some example embodiments. In the context of FIGS. 3A-3D, the sampler clocks being analyzed are consecutively generated through rotation of the PI 102. Further, in the example illustrated in FIG. 3A-3D, a transmitter transmits a repeating calibration data pattern of 32'h00FF00FF for the duration of calibration. As noted above, during calibration, the clock frequency of the sampler clock signals are the same phase relative to each other but are not the correct frequency to sample the incoming data. That is, the frequency may be either faster or slower than the frequency to accurately sample the incoming calibration data pattern. Therefore, over time, the sampling clocks will effectively sweep across the incoming calibration data pattern. FIGS. 3A-3D illustrate sample points where the sampling clocks are used to sample the incoming calibration data pattern as the sampling clocks sweep across the rising edge of the received calibration data pattern. In the particular example illustrated in FIG. 3A-3D, the transmitted 32'h00FF00FF data pattern creates a received data pattern that is 8 UI in the low state and 8 UI in the high state.

Figure 3A:
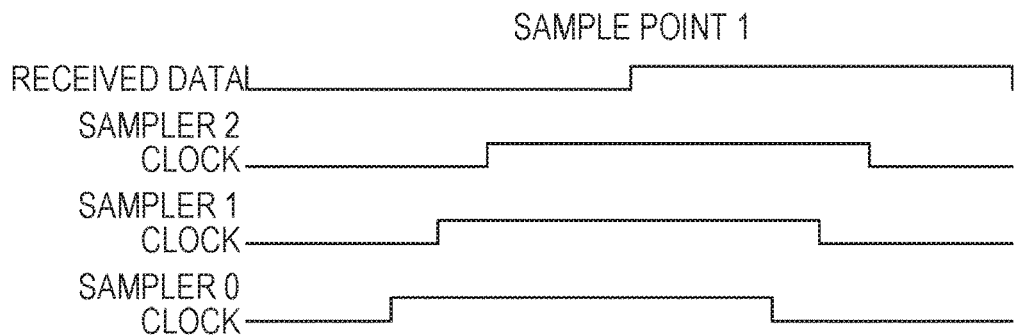
FIGS. 3A-3D are timing diagrams illustrating an operation of detecting phase relationships between sampler clocks, according to some example embodiments.
Figure 3B:
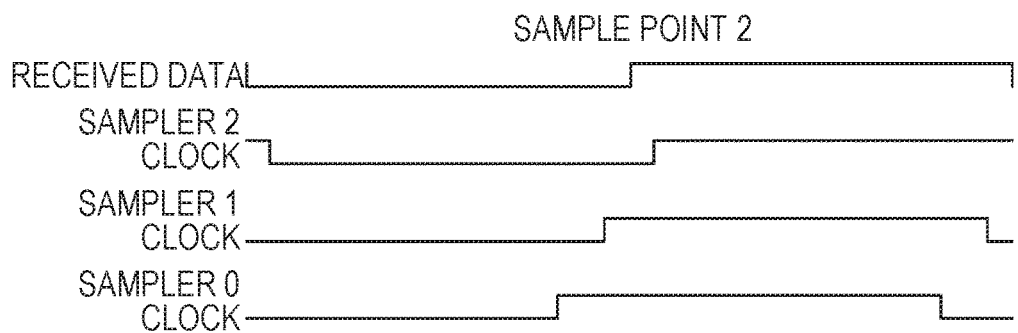
Figure 3C:
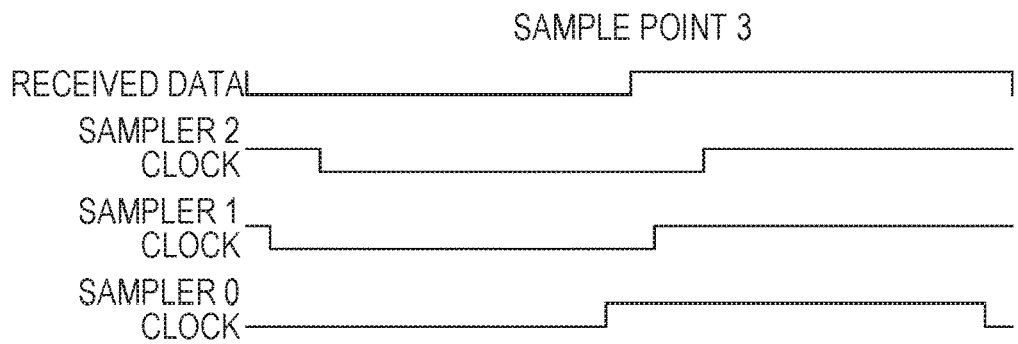
Figure 3D:
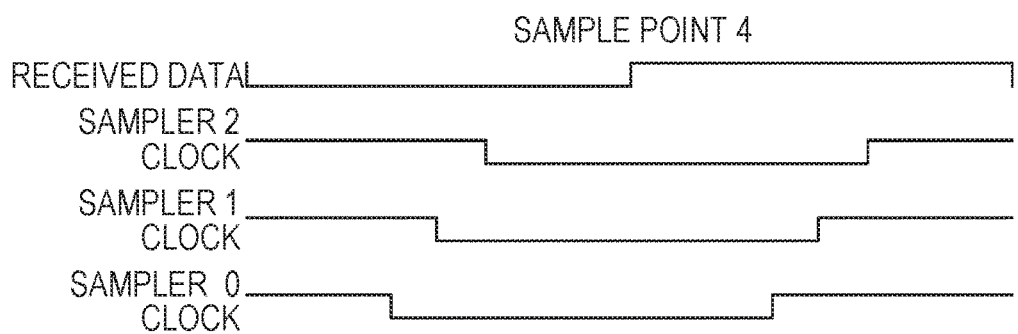

FIG. 3A illustrates a sample point 1 at which the three sampler clocks result in a sampled pattern of 3'b000. FIG. 3B illustrates a sample point 2 at which the three sampler clocks result in a sampled pattern of 3'b001. FIG. 3C illustrates a sample point 3 at which the three sampler clocks result in a sampled pattern of 3'b011. FIG. 3D illustrates a sample point 4 at which the three sampler clocks result in a sampled pattern of 3'b111.

Figure 4A:
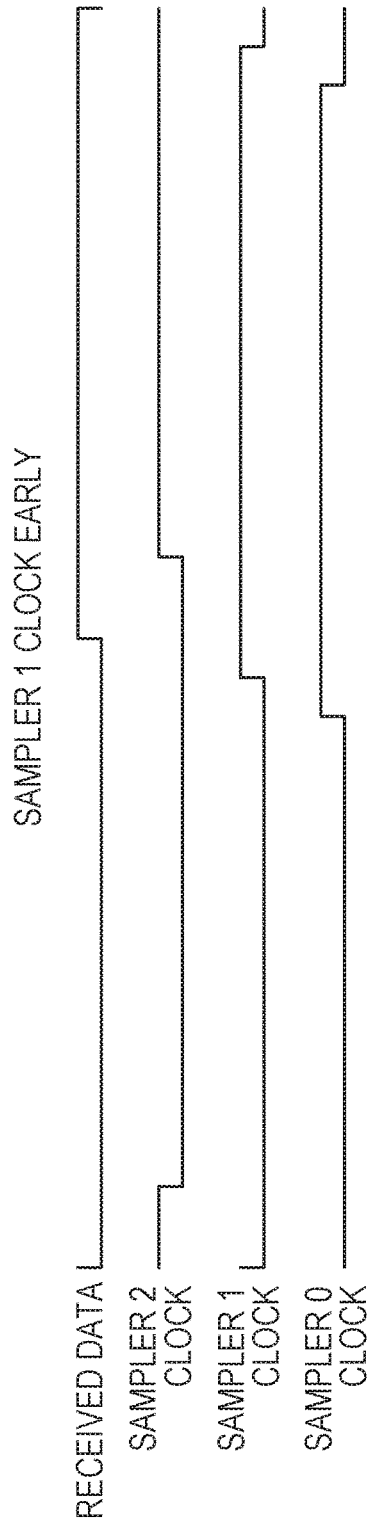
FIGS. 4A and 4B are timing diagrams illustrating example clock phase offsets, according to some example embodiments.
Figure 4B:
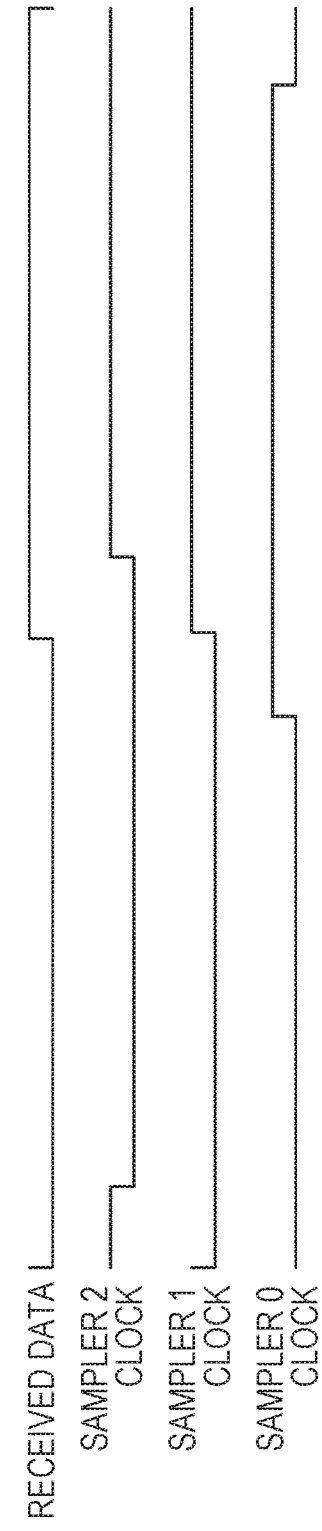

FIGS. 4A and 4B illustrate scenarios in which the phase of a sampler clock is not centered. More specifically, FIG. 4A illustrates an example in which a subject sampler clock (referenced in FIGS. 4A and 4B as "sampler clock 1) is "early" and FIG. 4B illustrates an example in which the subject sampler clock is "late." In instances in which a subject sampler clock is early, as illustrated in FIG. 4A, there will be more data patterns of 3'b001 than those of 3'b011, on average. Similarly, in instances in which the subject sampler clock is late, there will be more data patterns of 3'b011 than those of 3'b001, on average. Accordingly, the number of occurrences of each of these patterns in the sampled calibration pattern data can indicate a misalignment of phase relationships among the sampler clocks. What's more, in detecting a misalignment of the phase relationships, the most significant bit of the first pattern (3'b001) and the least significant bit of the second pattern (3'b01) can be ignored to speed up the process and decrease complexity while achieving the same results. Hence, if the calibration control component 106 counts more patterns of 3'bx01 than 3'b01x, as represented in FIG. 4A, the calibration control component 106 adjusts the early sampler clock to be later in time. Similarly, if the calibration control component 106 counts more patterns of 3'b01x than 3'bx01 in the sampled calibration data pattern, as represented in FIG. 4B, the calibration control component 106 adjusts the late sampler clock to be earlier in time.

In some embodiments, the counting of these patterns within the calibration control component 106 can be implemented with a accumulator, set to detect a range of twos complement values. A 3'b01x pattern decrements the accumulator and a 3'bx01 pattern increments the accumulator. If the accumulator reaches a predetermined maximum value, the calibration code that controls the clock delay element is adjusted to increase delay to the clock, and the accumulator is cleared to start the counting process over again. Similarly, if the accumulator reaches a predetermined minimum value, the calibration code that controls the clock delay element is adjusted to reduce delay to the clock, and the accumulator is cleared to start the counting process over again.

Adjusting of the edge sampler clock signal is slightly different. With the edge sampler clock signal, the three clocks of interest are the data sampler clock 0 (also referred to as "sampler clock 0" or "clock 0"), the edge sampler clock (also referred to as "sampler clock X" or "clock X"), and the sampler clock 1 (also referred to as "sampler clock 1" or "clock 1"). The same process applies for determining how to adjust the clock, based on the sampled data pattern. However, the edge sampler clock does not have an analog clock delay element associated with it. In this case, the sampler clock 0 is adjusted when the accumulator maximum or minimum value is reached. In this case, since the sampler data 0 clock is at the edge of the three clocks and not the middle, its adjustment is made in the opposite direction. Therefore, when the accumulator reaches the predetermined maximum value, the calibration code that controls the sampler clock 0 delay element is adjusted to reduce delay to the clock. Similarly, when the accumulator reaches predetermined minimum value, the calibration code that controls the sampler clock 0 delay element is adjusted to increase delay to the clock.

As noted above, sampler clocks are calibrated using two other sampler clocks. In the example described above, the three sampler clocks are consecutive sampler clocks. However, the calibration process described herein is not limited to calibration using consecutive sampler clocks. Indeed, in other embodiments, two non-consecutive sampler clocks can be used to calibrate a sampler clock. Table 1 presented below provides an example of how sampler clocks are grouped for calibration purposes.

TABLE 1

| Clock A | Clock B | Clock C | Calibrated Clock |
| --- | --- | --- | --- |
| Clock 0 | Clock X | Clock 1 | Clock 0 |
| Clock 0 | Clock 1 | Clock 2 | Clock 1 |
| Clock 1 | Clock 2 | Clock 3 | Clock 2 |
| Clock 1 | Clock 3 | Clock 5 | Clock 3 |
| Clock 1 | Clock 4 | Clock 7 | Clock 4 |
| Clock 2 | Clock 5 | Clock 0 | Clock 5 |
| Clock 4 | Clock 6 | Clock 0 | Clock 6 |
| Clock 6 | Clock 7 | Clock 0 | Clock 7 |

As shown, a given sampler clock is not necessarily calibrated to be centered between adjacent clocks (the two clocks immediately next to it). In these instances, the sampler clock undergoing calibration is centered between two non-adjacent sampler clocks, just not the ones immediately next to it. Some amount of error is present in the clocks even after calibrations due to non-linearity in the PI and quantization noise. Calibrating using adjacent clocks tends to accumulate this error. Using non-adjacent clocks for calibration can minimize this error accumulation. In the case of "clock 0," the "clock X" cannot be adjusted. In this case, the calibration code direction is reversed to adjust "clock 0" relative to "clock X" and "clock 1."

It shall be appreciated that the calibration control component 106 can adjust all sampler clocks simultaneously, and the clock phases will converge to the ideal phase relationship. All calibration circuits can be enabled and run for a defined period of time and then disabled, and the sampler clocks will be at target phase relationship.

Figure 5:
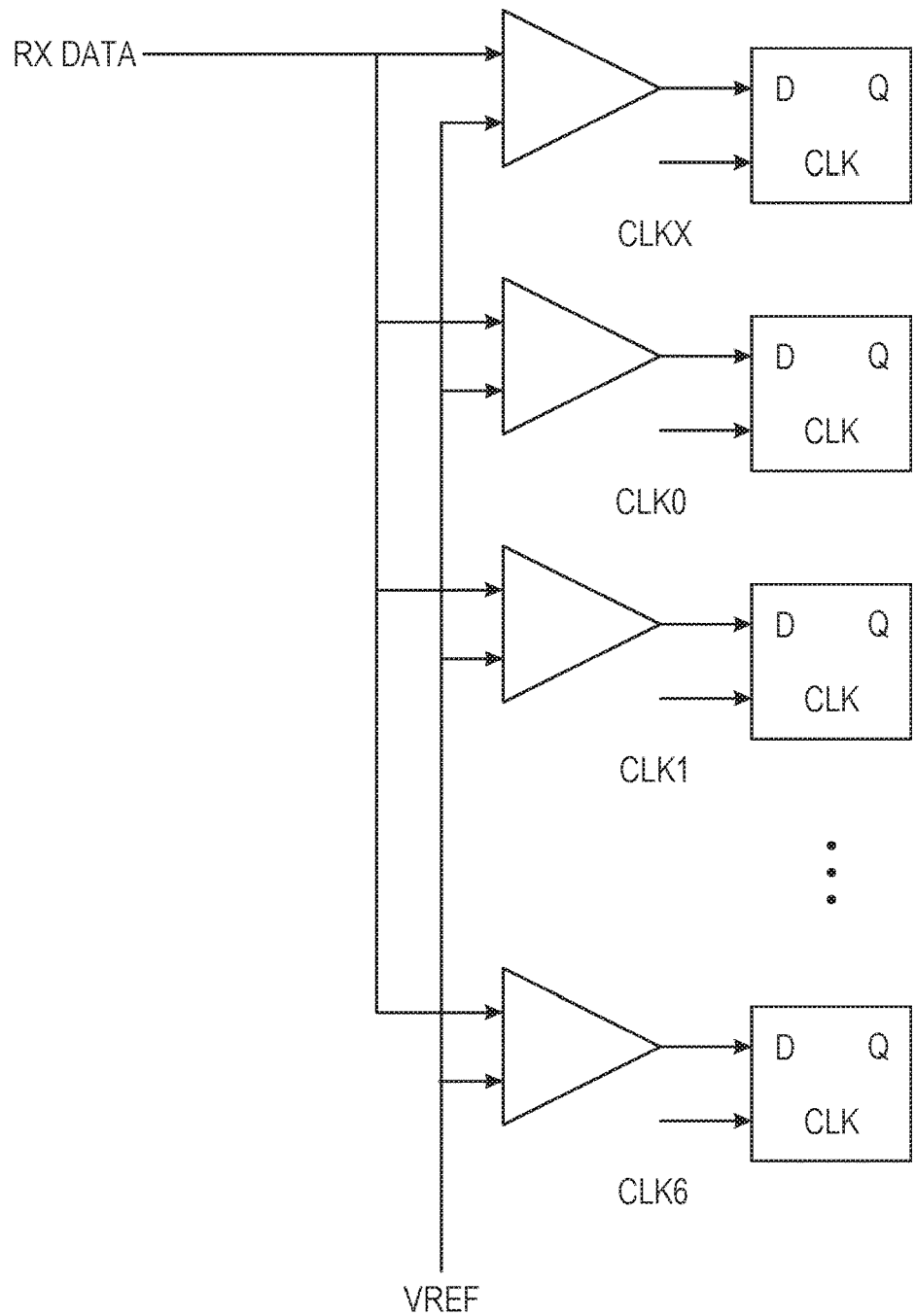
FIG. 5 is a block diagram illustrating a set of samplers, according to some example embodiments.

FIG. 5 is a block diagram illustrating the samplers 104, according to some example embodiments. As shown, the samplers 104 comprise multiple sampler latches. More specifically, the samplers 104 includes a sampler latch for each clock signal in the sampler clock signals driven by the PI 102. In the example illustrated in FIG. 5, the samplers 104 include N sampler latches to receive N clock signals, where at least one clock signal is a edge sampler clock (a zero-crossing sampler clock). As noted above, the rising edge of the edge sampler clock signal is equal in time between a first sampler clock and a second sampler clock in the set of sampler clocks. Each sampler latch samples input data based on a corresponding sampler clock signal. That is, each sampler extracts samples from the input data by latching onto the input data at the rising edge of the corresponding sampler clock signal.

Figure 6:
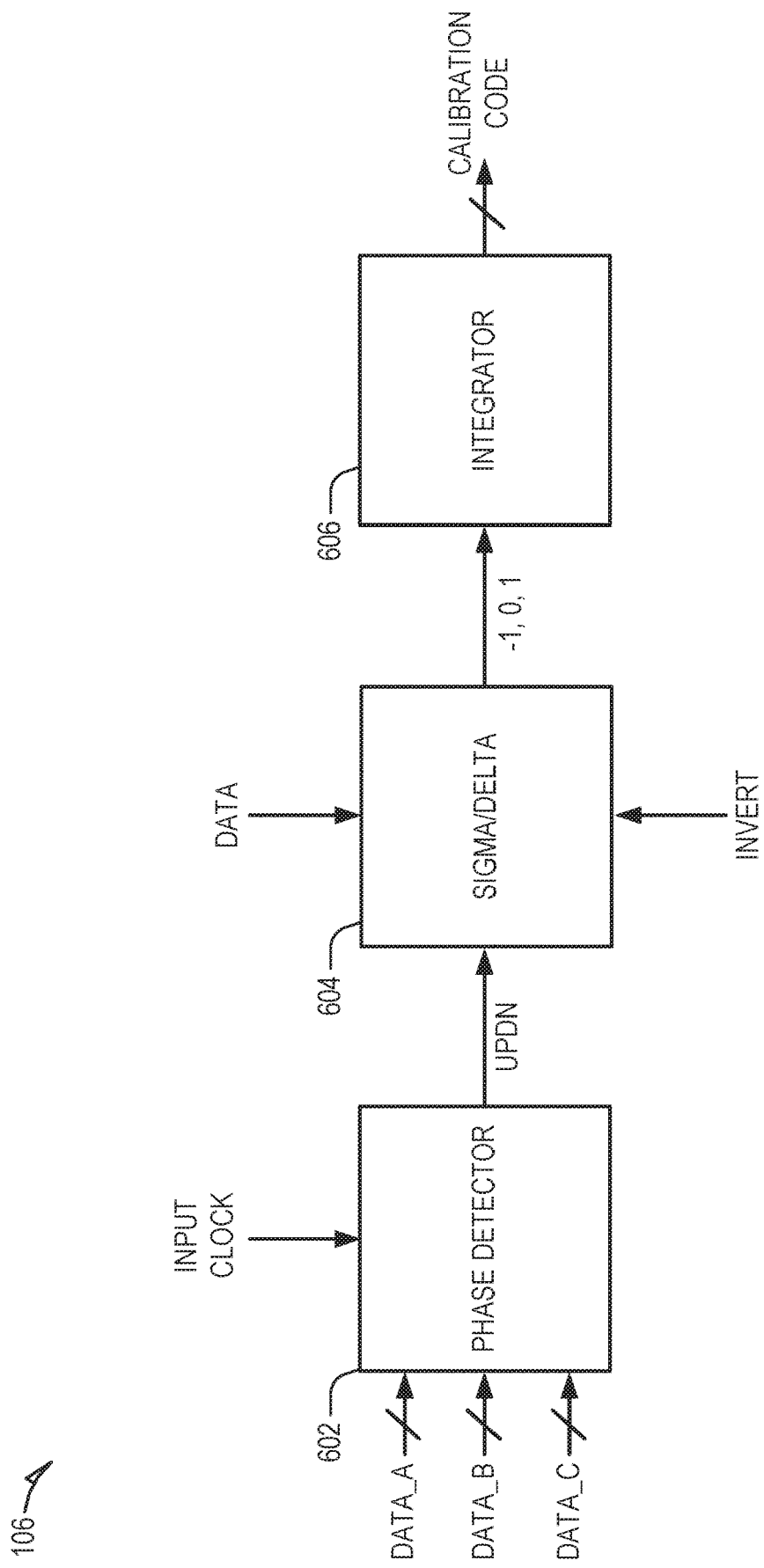
FIG. 6 is a block diagram illustrating details of a calibration control component, according to some example embodiments.

FIG. 6 is a block diagram illustrating details of a calibration control component 106, which is included in the device 100, according to some example embodiments. As shown, the calibration control component 106 comprises a phase detector 602, a sigma/delta modulator 604, and an integrator 606. The device 100 can include an instance of each of these components for each sampler clock generated by the PI 102. That is, the device 100 can include N phase detectors 602, N sigma/delta modulators 604, and N integrators 606 to calibrate N sampler clocks.

The phase detector 602 receives sampled data from the sampler 104 at as input. As shown, the sampled data is received as three sets of data signals (DATA_A, DATA_B, and DATA_C). Each data signal corresponds to a sampler clock. That is, DATA_A includes data sampled using a first sampler clock, DATA_B includes data sampled using a second sampler clock, and DATA_C includes data sampled using a third sampler clock.

The phase detector 602 generates an output signal (illustrated as "UPDN") that indicates detected clock skews based on the sampled data. The phase detector can generate the signal based on occurrences of certain predefined patterns in the sampled data (e.g., "0x1" and "1x0") or based simply on occurrences of 1s and 0s. The phase detector 602 output signal is provided to the sigma/delta modulator 604.

The sigma/delta modulator 604 generates counts and compares occurrences of the predefined patterns or 1s and 0s in the sampled data and generates an output signal that indicating an increment or decrement to a calibration code used to correct any misalignment between phase relationships in the sampler clocks. The sigma/delta 304 output is provided to the integrator 606, which generates the calibration code based there on.

Collectively, the phase detector 602, sigma/delta modulator 604, and integrator 606 work in conjunction to detect and correct misalignment in phase relations among sampler clocks by counting occurrences of predefined patterns in the data to detect misalignment, and using the counts to generate a calibration code to provide to the PI 102 to phase shift sampler clocks to correct misalignment of phase relationships.

Figure 7:
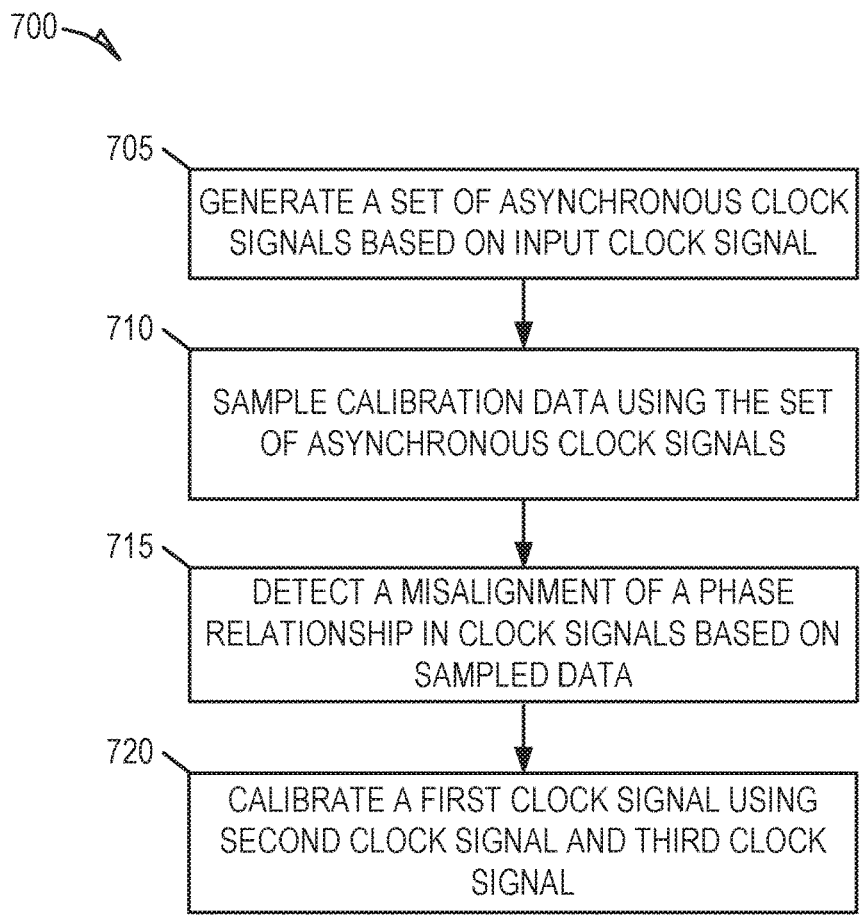
FIG. 7 is a flow diagram illustrating operations of a method for static clock calibration, according to some example embodiments.

FIG. 7 is a flow diagram illustrating operations of a method 700 for static clock calibration, according to some example embodiments. The method is performed by the device 100. Accordingly, the method 700 is described in reference to the components of the device 100. The method 700 can be initiated at system start-up, or in embodiments in which the device 100 is part of a RX PHY, at any time during normal operation in which data transfer is not occurring within the RX PH.

At operation 705, the PI 102 generates a set of asynchronous clock signals based on an input clock signal. In generating the set of asynchronous clock signals, the PI 102 constantly rotates at a rate that allows the calibration process to complete in a reasonable time while ensuring the phase interpolator can keep up with calibration updates.

The samplers 104 sample input calibration data using the set of asynchronous clock signals, at operation 710. The sampling of the input calibration data results in sampled data, which is output to the calibration control component 106. The input calibration data can be provided by a transmitting PHY connected to the RX PHY. For example, the transmitting PHY may send a 0xFF00FF00 pattern to the RX PHY.

The calibration control component 106, at operation 715, detects a misalignment of one or more phase relationships among the set of asynchronous clock signals based on the sampled data. In a first example, the calibration control component 106 can detect a misalignment by counting the number of 1s and 0s in the sampled data and comparing the two counts. In a second example, the calibration control component 106 can detect a misalignment by counting the number of occurrences of two predefined patterns (e.g., "x01" and "01X") in the sampled data and comparing the two counts. The calibration data is configured such that the occurrences of the two counts are equal if the phase relationships between the clock signals are aligned. A misalignment of a phase relationship is detected by the calibration control component 106 if the two counts are not equal.

At operation 720, the calibration control component 106 calibrates the set of asynchronous clock signals based on detecting the misalignment of one or more phase relationships among the set of asynchronous clock signals. The calibration control component 106 calibrates a clock signal from the set of asynchronous clock signals using two other clock signals in the set. For example, the calibration control component 106 calibrates a first clock signal using a second clock signal and a third clock signal. More specifically, the calibration control component 106 calibrates the first clock signal such that it is in quadrature with the second clock signal and the third clock signal. To do so, the calibration control component 106 performs a phase adjustment on the first clock signal. That is, the calibration control component 106 phase shifts the first clock signal such that it is in quadrature with the second clock signal and the third clock signal. To phase shift the clock signal, the calibration control component 106 provides a calibration code to the PI 102 that causes the PI 102 to phase shift the first clock signal.

It shall be appreciated that the methodologies for calibrating the set of asynchronous clock signals described herein such as in reference to method 700 are not limited to producing a set of equally spaced clock signals. That is, these methodologies are not limited to any specific calibration patterns, patterns analyzed from the sampled data, or ratio of patterns in the sampled data and different calibration patterns other than those described herein may be used, different patterns in the sampled data may be analyzed other than the ones described herein, and the ratio of the patterns in the sampled data can be varied to create custom spaced clock signals while employing the same methodologies as described herein.

Figure 8:
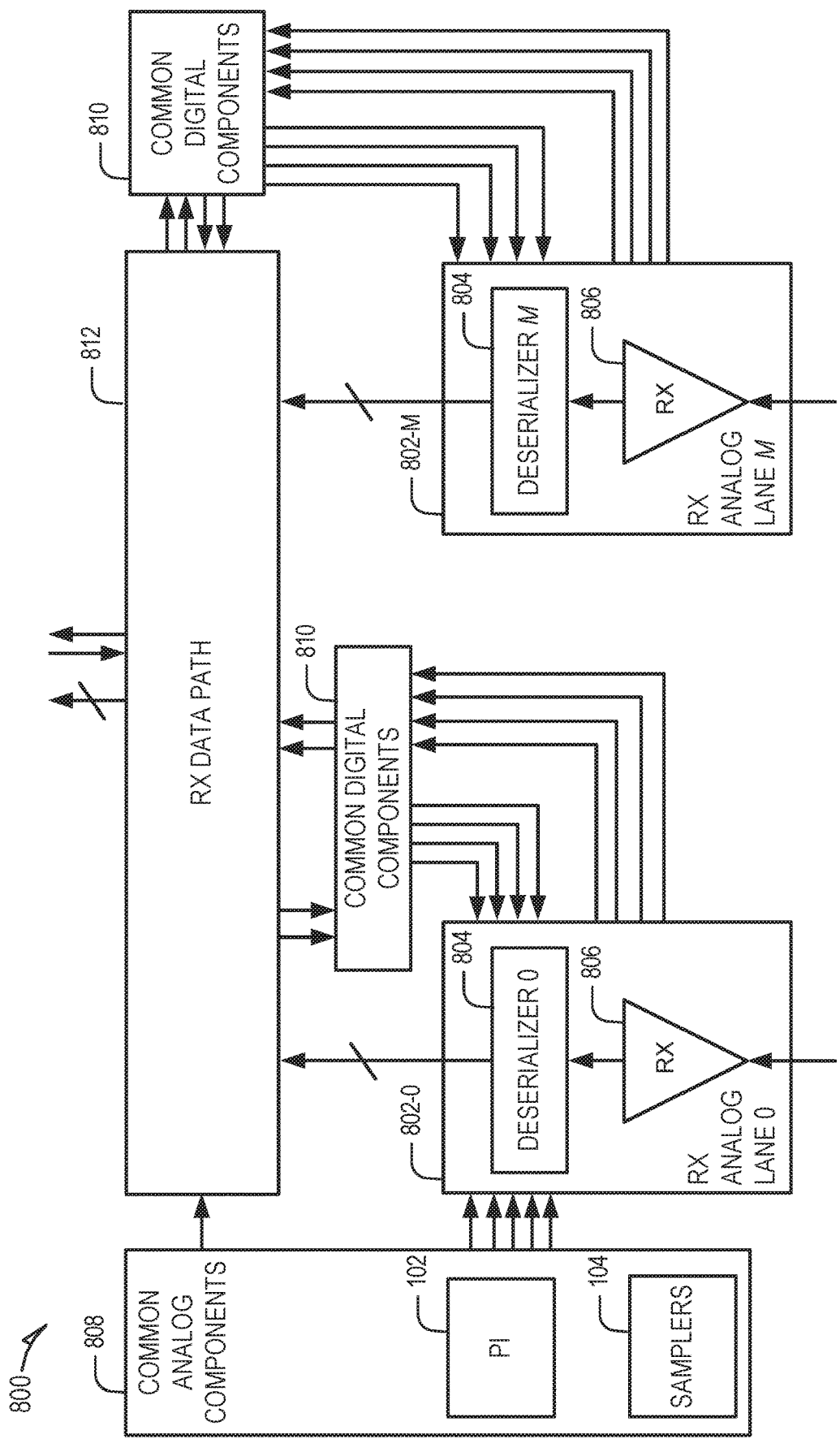
FIG. 8 is a block diagram illustrating a RX PHY, within which the PHY device configured for static clock calibration can be implemented, according to some example embodiments.

With reference to FIG. 8, a RX PHY 800 for serial data communication is illustrated, according to some example embodiments. The RX PHY 800 is an example environment in which the PHY device 100 can be implemented. The RX PHY 800 includes multiple analog RX lanes 802-1 to 802-M. Each analog RX lane 802-1 to 802-M includes a receiver 806 to receive serialized data from a TX PHY and a deserializer 804 to deserialize the received serial data.

Each of the RX analog lanes of the RX PHY 800 are coupled to common analog components 808 and common digital components 810. The common analog components 808 can, for example, include the PI 102, the samplers 104, a bandgap circuit, and a high-speed clock distribution network. The common digital components 810 can include a start-up state machine to define behavior of the RX PHY 800 at start-up (e.g., executing a calibration sequence) and a bandgap calibration component. An RX data path 812 of the RX PHY 800 may include a de-scrambler component, a decoding component, an encoded data de-interleaving component, and a BIST pattern generation checker.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A device comprising:
a phase interpolator to provide a set of sampler clocks;
a sampler connected to the phase interpolator, the sampler to sample a calibration data pattern using a first sampler clock from the set of sampler clocks and provide sampled data at a sampler output; and
a calibration control component connected to the sampler and the phase interpolator, the calibration control component to perform operations comprising:
detecting a misalignment of a phase relationship among the set of sampler clocks based on the sampled data; and
in response to detecting the misalignment, calibrating the first sampler clock using a second sampler clock and a third sampler clock in the set of sampler clocks.

2. The device of claim 1, wherein the detecting of the misalignment of the phase relationship comprises:
counting a number of occurrences of a first pattern in the sampled data;
counting a number of occurrences of a second pattern in the sampled data; and
comparing the number of occurrences of the first pattern to the number of occurrences of the second pattern.

3. The device of claim 2, wherein the detecting of the misalignment is based on a difference in the number of occurrences of the first pattern and the number of occurrences of the second pattern.

4. The device of claim 2, wherein the first sampler clock is calibrated such that there are equal occurrences of the first pattern and the second pattern in the sampled data.

5. The device of claim 1, wherein the calibrating of the first sampler clock comprises adjusting a phase of the first sampler clock.

6. The device of claim 5, wherein the calibration control component adjusts the phase of the first sampler clock by providing a calibration code to the phase interpolator that causes the phase interpolator to phase shift the first sampler clock.

7. The device of claim 1, wherein the calibrating of the first sampler clock comprises phase shifting the first sampler clock such that the first sampler clock is in quadrature with the second sampler clock and the third sampler clock.

8. A method comprising:
generating, by a phase interpolator, a set of asynchronous clock signals;
sampling, by a sampler, input calibration data using the set of asynchronous clock signals, the sampling resulting in sampled data;
detecting, at a calibration control component, a misalignment of a phase relationship in the set of asynchronous clock signals based on the sampled data; and
in response to detecting the misalignment, calibrating a first clock signal in the set of asynchronous clock signals using a second clock signal and a third clock signal in the set of asynchronous clock signals, the calibrating of the first clock signal comprising phase shifting the first clock signal such that the first clock signal is in quadrature with the second clock signal and the third clock signal.

9. The method of claim 8, wherein the detecting of the misalignment of the phase relationship comprises:
counting a number of occurrences of a first pattern in the sampled data;
counting a number of occurrences of a second pattern in the sampled data; and
comparing the number of occurrences of the first pattern to the number of occurrences of the second pattern,
wherein the detecting of the misalignment is based on a difference in the number of occurrences of the first pattern and the number of occurrences of the second pattern.

10. The method of claim 9, wherein the first clock signal is calibrated such that there are equal occurrences of the first pattern and the second pattern in the sampled data.

11. The method of claim 8, wherein the detecting of the misalignment of the phase relationship comprises:
determining a count of 1s in the sampled data; and
determining a count of 0s in the sampled data,
wherein the detecting of the misalignment is based on a difference in the count of 1s and 0s in the sampled data.

12. The method of claim 8, wherein the calibrating of the first clock signal comprises adjusting a phase of the first clock signal.

13. The method of claim 12, wherein the adjusting of the phase of the first clock signal comprises providing a calibration code to the phase interpolator that causes the phase interpolator to phase shift the first clock signal.

14. The method of claim 8, wherein the first clock signal is calibrated such that there are equal occurrences of 0s and 1s in the sampled data.

15. A device comprising:
a phase interpolator to generate a set of asynchronous sampler clocks based on an input clock signal; and
a calibration control component connected to the phase interpolator, the calibration control component comprising:
a phase detector to generate an output signal based on occurrences of two predefined patterns in sampled data generated by sampling input calibration data using the set of asynchronous sampler clocks;
a sigma/delta modulator to generate a count based on the occurrences of the two predefined patterns in sampled data; and
an integrator to generate a calibration code to adjust a phase of a first sampler clock based on the count.

16. The device of claim 15, further comprising a set of samplers to generate the sampled data based on the input calibration data.

17. The device of claim 15, wherein the first sampler clock is such that there are equal occurrences of the two predefined patterns in the sampled data.

18. The device of claim 15, wherein the calibration code causes the phase interpolator to phase shift the first sampler clock.

19. The device of claim 15, wherein the adjusting of the phase of the first sampler clock comprises phase shifting the first sampler clock such that the first sampler clock is in quadrature with a second sampler clock and a third sampler clock.

20. The device of claim 15, wherein the calibration control component detects a misalignment in a phase relationship among the set of asynchronous sampler clocks based on the count.

* * * * *